(12) United States Patent
Lee et al.

(10) Patent No.: US 8,604,582 B2
(45) Date of Patent: Dec. 10, 2013

(54) SCHOTTKY DIODE

(75) Inventors: Jam-Wem Lee, Zhubei (TW); Yi-Feng Chang, Xinbei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 9 days.

(21) Appl. No.: 13/271,725

(22) Filed: Oct. 12, 2011

(65) Prior Publication Data
US 2013/0093038 A1      Apr. 18, 2013

(51) Int. Cl.
   *H01L 29/47* (2006.01)
(52) U.S. Cl.
   USPC ........................... 257/471; 257/476
(58) Field of Classification Search
   USPC ............... 257/471, 475, 476, 478, 483, 484, 257/E29.338, 127; 438/571, 573
   See application file for complete search history.

(56) References Cited

U.S. PATENT DOCUMENTS

| | | | |
|---|---|---|---|
| 6,747,294 B1 * | 6/2004 | Gupta et al. | 257/127 |
| 6,924,531 B2 * | 8/2005 | Chen et al. | 257/336 |
| 7,309,883 B2 * | 12/2007 | Ahn et al. | 257/173 |
| 7,777,248 B1 * | 8/2010 | Boyd et al. | 257/127 |
| 7,808,069 B2 | 10/2010 | Ho et al. | |
| 2007/0007545 A1 * | 1/2007 | Salcedo et al. | 257/127 |
| 2007/0057280 A1 * | 3/2007 | Hayashi et al. | 257/127 |
| 2009/0261378 A1 * | 10/2009 | Salcedo et al. | 257/127 |
| 2009/0294865 A1 * | 12/2009 | Tang et al. | 257/369 |
| 2010/0164050 A1 * | 7/2010 | Ho et al. | 257/484 |
| 2010/0301400 A1 | 12/2010 | Lin et al. | |
| 2010/0317158 A1 * | 12/2010 | Yilmaz et al. | 438/138 |
| 2011/0284922 A1 * | 11/2011 | Salcedo et al. | 257/119 |
| 2012/0086099 A1 * | 4/2012 | Yeh et al. | 257/475 |

* cited by examiner

*Primary Examiner* — Jae Lee
(74) *Attorney, Agent, or Firm* — Slater & Matsil, L.L.P.

(57) ABSTRACT

An embodiment is a semiconductor structure. The semiconductor structure comprises a p-type region in a substrate; a first n-type well in the p-type region; a first p-type well in the p-type region; and a second p-type well in the first p-type well. A concentration of a p-type impurity in the first p-type well is less than a concentration of a p-type impurity in the second p-type well. Additional embodiments further comprise further n-type and p-type wells in the substrate. A method for forming a semiconductor structure is also disclosed.

19 Claims, 4 Drawing Sheets

SCHOTTKY DIODE

BACKGROUND

Applying a metal layer to a surface of a doped semiconductor material, e.g., a layer enriched or depleted of carrier charges, creates a contact region having properties comparable to a p-n junction in a semiconductor material. The common name for this metal-semiconductor contact region is a Schottky diode. The ability of Schottky diodes to substantially restrict current flow to one direction is a property heavily relied upon in the manufacture and design of integrated circuits. When forward biased, a Schottky diode is in an "on" state and current flows through the diode. When the diode is reverse biased, a Schottky diode is in an "off" state and ideally will not allow current to flow. However, Schottky diodes are generally not ideal and thus typically experience a small amount of reverse leakage current, which flows back through the diode when the diode should not be conducting current.

Reverse leakage can be detrimental to the performance of a circuit and may result in a loss of power in the circuit. A portion of the reverse leakage current can arise from the physical junction interaction between the Schottky metal, or Schottky barrier, and an adjacent semiconductor material. Regardless of its source, reverse leakage current usually induces undesirable characteristics in the operation of an electronic device, such as reducing efficiency.

The breakdown voltage of a Schottky diode is generally the maximum amount of reverse voltage that may be applied to the diode before the diode begins to breakdown and experiences an exponential increase in reverse leakage current. The ability to apply a greater reverse voltage to a Schottky diode without the diode breaking down (greater breakdown voltage) enables the diode to be integrated into circuits for higher voltage applications, e.g., applications having voltage levels that exceed a few volts.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a Schottky diode. Embodiments may be used in many applications, such as high voltage structures, automotive applications, etc.

Figure 1:
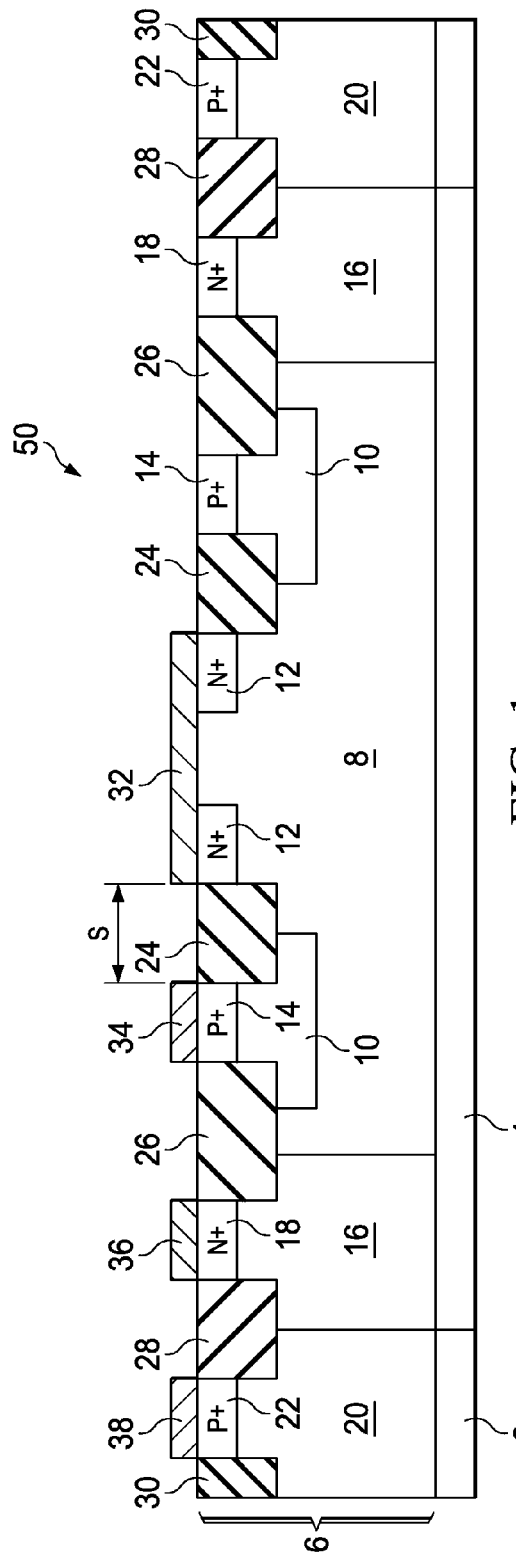
FIG. 1 is a cross-sectional view of a Schottky diode according to an embodiment.

FIG. 1 illustrates a cross-sectional view of a Schottky diode 50 according to an embodiment. The diode 50 comprises a deep n-type buried layer (NBL) 4 in a semiconductor substrate 2. An epitaxial layer (epi-layer) 6 is over the top surface of the semiconductor substrate 2. The NBL 4 acts as a barrier layer between the semiconductor substrate 2 and the epi-layer 6 above the substrate 2. It should be noted that the substrate 2 can also be referenced to include the epi-layer 6. Any distinction between the substrate 2 and the epi-layer 6 is for convenience of description, and embodiments contemplate structures, for example, in which various components are formed in and/or on a substrate without an epi-layer 6.

The epi-layer 6 includes an epi p-type region 8. A p-type well 10 is in the epi p-type region 8 in the form of an enclosed structure, such as a ring, rectangle, other shape, or a combination thereof, along the top surface of the epi-layer 6 and extending from the top surface of the epi-layer 6 to a depth in the epi-layer 6. A highly-doped p-type well (P+ well) 14 is in the p-type well 10 also in the form of the enclosed structure along the top surface of the epi-layer 6. The P+ well 14 extends from the top surface of the epi-layer 6 to a depth in the p-type well 10. A highly-doped n-type well (N+ well) 12 is in the epi p-type region 8 in the form of an enclosed structure along a top surface of the epi-layer 6. The N+ well 12 is within the p-type well 10 and the P+ well 14 along the top surface of the epi-layer 6.

The epi-layer 6 further includes high voltage n-type well (HVNW) 16 over the NBL 4 and around the epi p-type region 8. The HVNW 16 extends from a top surface of the epi-layer 6 to the NBL 4. An N+ well 18 is in the HVNW 16 in the form of an enclosed structure along the top surface of the epi-layer 6 around the P+ well 14. The N+ well 18 extends from the top surface of the epi-layer 6 to a depth in the HVNW 16. The epi-layer 6 also includes a high voltage p-type well (HVPW) 20 around the HVNW 16. The HVPW 20 extends from a top surface of the epi-layer 6 to a top surface of the semiconductor substrate 2. A P+ well 22 is in the HVPW 20 in the form of an enclosed structure along the top surface of the epi-layer 6 around the N+ well 18. The P+ well 22 extends from the top surface of the epi-layer 6 to a depth in the HVPW 20.

The diode 50 also comprises isolation structures, such as trench isolations, between adjacent N+ wells and P+ wells. An isolation structure 24 is between the N+ well 12 and the P+ well 14 extending from a top surface of the epi-layer 6 to a depth greater than both of the N+ well 12 and the P+ well 14. The isolation structure 24 has a lateral distance S between an interior edge and an exterior edge. An isolation structure 26 is between the P+ well 14 and the N+ well 18 extending from a top surface of the epi-layer 6 to a depth greater than both of the P+ well 14 and the N+ well 18. An isolation structure 28 is between the N+ well 18 and the P+ well 22 extending from a top surface of the epi-layer 6 to a depth greater than both of the N+ well 18 and the P+ well 22. An isolation structure 30 is around the P+ well 22 extending from a top surface of the epi-layer 6 to a depth greater than the P+ well 22.

The diode 50 further comprises a cathode contact 32, an anode contact 34, a first isolation contact 36, and a substrate contact 38 on the top surface of the epi-layer 6. The cathode contact 32 contacts an area of the epi p-type region 8 and the N+ well 12 at the top surface of the epi-layer 6. The anode contact 34 contacts an area of the P+ well 14 at the top surface of the epi-layer 6. The first isolation contact 36 contacts an area of the N+ well 18 at the top surface of the epi-layer 6. The substrate contact 38 contacts an area of the P+ well 22 at the top surface of the epi-layer 6.

The following materials, concentrations, dimensions, etc. are examples of what is contemplated by embodiments; other embodiments contemplate modifications and differences from these examples. The semiconductor substrate 2 can be a silicon substrate, a silicon germanium (SiGe) substrate, a group III-V compound substrate, a semiconductor-on-insulator (SOI) substrate, the like, or a combination thereof. The epi-layer 6 can be silicon, SiGe, germanium, a group III-V compound, the like, or a combination thereof, epitaxially grown on the semiconductor substrate 2. The various p-type wells can be doped, such as by an implant and/or in situ, with a p-type impurity, such as boron, gallium, aluminum, a group III element, the like, or a combination thereof. The various n-type wells can be doped, such as by an implant and/or in situ, with an n-type impurity, such as arsenic, phosphorus, antimony, a group V element, the like, or a combination thereof. The isolation structure may be an insulator and/or dielectric, such as silicon oxide (SiO), silicon nitride (SiN), tetraethyl orthosilicate (TEOS), silicon oxynitride (SiON), silicon carbide (SiC), the like, or a combination thereof. The contacts 32, 34, and 36 may be a metal, such as aluminum, tungsten, copper, nickel, cobalt, titanium, nickel iron, molybdenum, platinum, palladium, silver, gold, a metal silicide, such as silicides of the listed metals, the like, or a combination thereof.

The thickness of the epi-layer 6, such as from the top surface of the epi-layer 6 to the top surface of the semiconductor substrate 2, can be between about 3 µm to about 5 µm. The depth of the p-type well 10 can be between about 0.3 µm and about 1 µm. The depth of the N+ well 12, the P+ well 14, the N+ well 18, and the P+ well 22 can be between about 0.1 µm and about 0.2 µm. The lateral distance S of the isolation structure 24 can be between about 0.5 µm and about 20 µm.

The impurity concentration in the NBL 4 can be between about $10^{15}$ cm$^{-3}$ and about $10^{17}$ cm$^{-3}$. The impurity concentration in the epi p-type region 8 can be between about $10^{14}$ cm$^{-3}$ and about $10^{16}$ cm$^{-3}$. The impurity concentration in the p-type well 10 can be between about $10^{17}$ cm$^{-3}$ and about $10^{18}$ cm$^{-3}$. The impurity concentration in the HVNW 16 can be between about $10^{15}$ cm$^{-3}$ and about $10^{17}$ cm$^{-3}$. The impurity concentration in the HVPW 20 can be between about $10^{15}$ cm$^{-3}$ and about $10^{17}$ cm$^{-3}$. The impurity concentration in the N+ well 12 can be between about $10^{19}$ cm$^{-3}$ and about $10^{22}$ cm$^{-3}$. The impurity concentration in the P+ well 14 can be between about $10^{19}$ cm$^{-3}$ and about $10^{22}$ cm$^{-3}$. The impurity concentration in the N+ well 18 can be between about $10^{19}$ cm$^{-3}$ and about $10^{22}$ cm$^{-3}$. The impurity concentration in the P+ well 22 can be between about $10^{19}$ cm$^{-3}$ and about $10^{22}$ cm$^{-3}$.

Figure 2A:
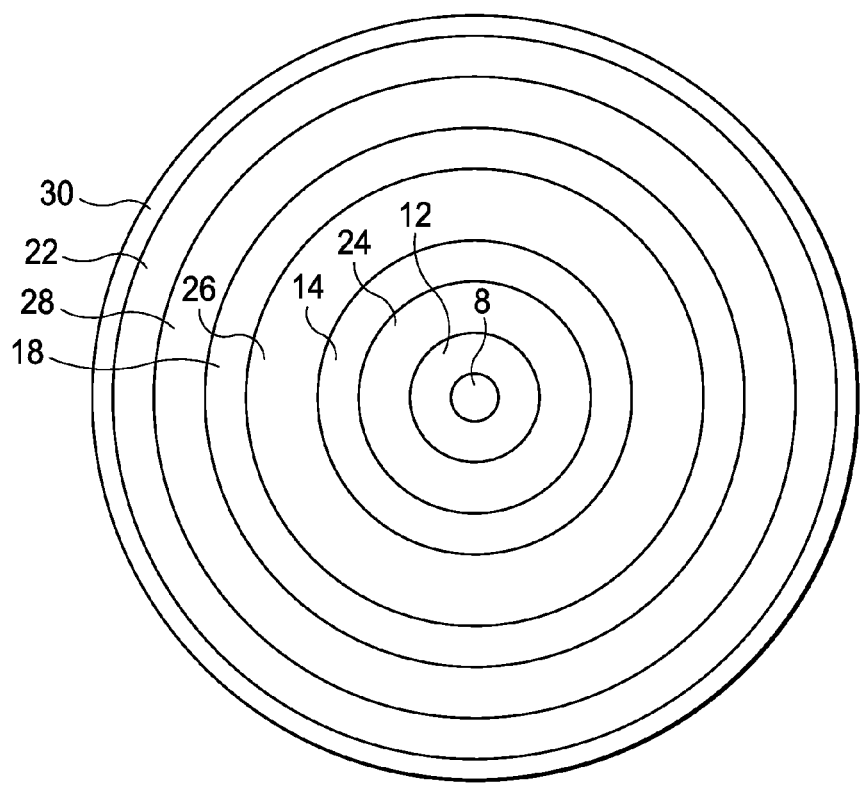
FIGS. 2A and 2B are layout views of the top surface of the diode according to different embodiments.
Figure 2B:
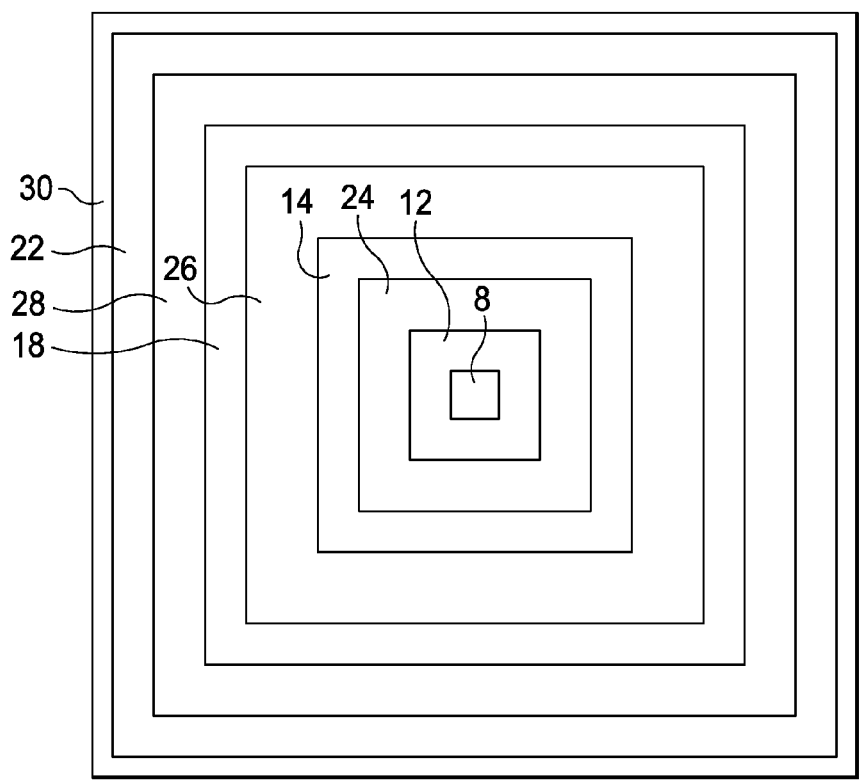

FIGS. 2A and 2B are layout views of the top surface of the epi-layer 6 according to different embodiments. In FIG. 2A, the enclosed structure of the various wells is circular, and in FIG. 2B, the enclosed structure is rectangular. It should be noted that other embodiments contemplate other enclosed configurations, and still further embodiments contemplate structures in which the wells are not enclosed along the top surface of the epi-layer 6.

Figure 3:
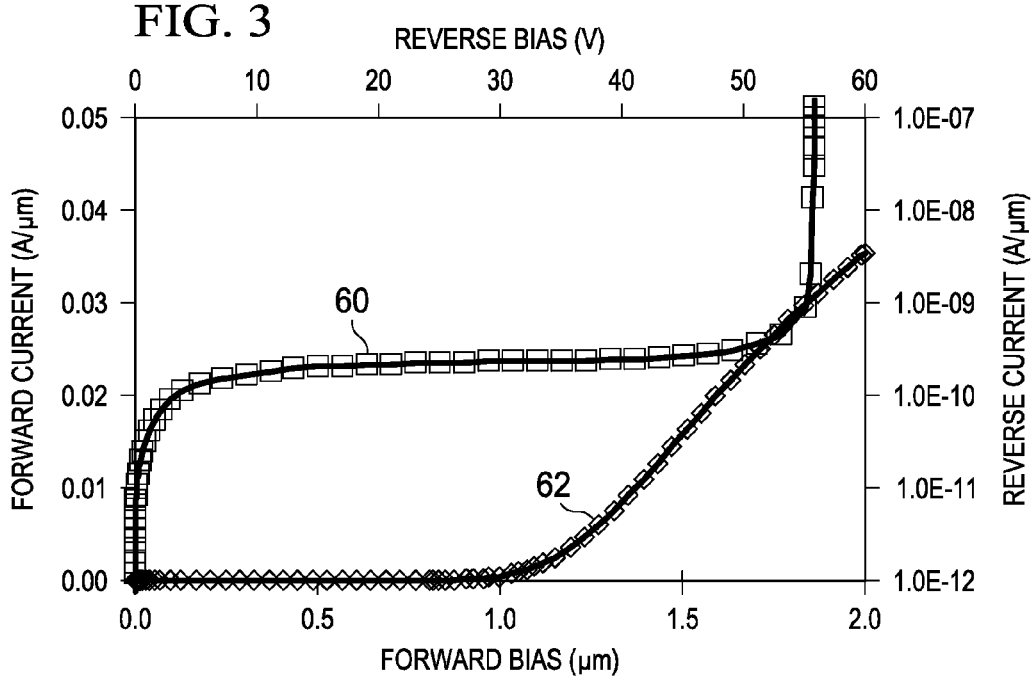
FIG. 3 is a chart of a current flow for a reverse bias voltage and a current flow for a forward bias voltage of the diode in FIG. 1.

FIG. 3 is a chart of a current flow 60 for a reverse bias voltage and a current flow 62 for a forward bias voltage of the diode 50 in FIG. 1. As shown in the chart, the reverse bias breakdown voltage occurs at a reverse bias of approximately 56 V, and the forward current occurs as approximately 0.7 V. The breakdown voltage can be a function of the lateral distance S of the isolation structure 24 between the N+ well 12 and the P+ well 14. For example, the greater the lateral distance S, the greater the breakdown voltage, and the smaller the lateral distance S, the smaller the breakdown voltage. This lateral distance S and the effect on the breakdown voltage can also affect an S-factor. It should be noted that these values for this embodiment is when the enclosed structure has a circular or ring shape with a diameter measured from the outer edge of N+ well 18 of approximately 9.5 µm. Other shapes and dimensions may have different breakdown voltages.

Figure 4:
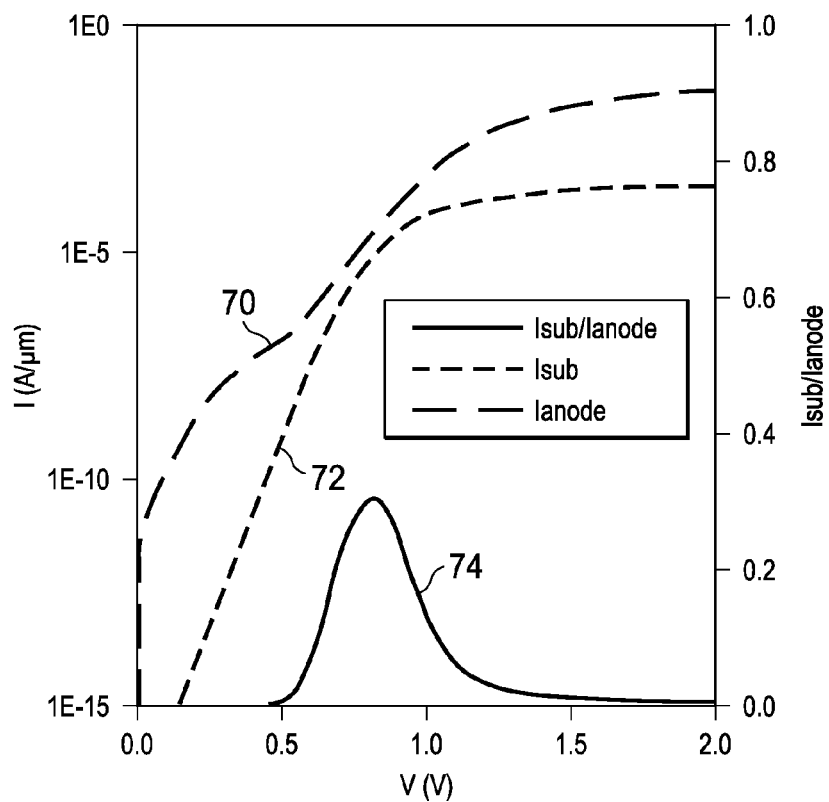
FIG. 4 is a chart of various current flows and beta (β) value of the diode in FIG. 1.

FIG. 4 is a chart of various current flows and beta (β) value of the diode 50 in FIG. 1. The chart identifies a current flow of amps per micrometer (A/µm) and a β-value 74 as a number, each as a function of voltage (V). Current flow 70 illustrates the current flow through the anode. The dip in the curve is the point at which the Schottky current turns on. Current flow 72 is the current flow through the substrate, such as a leakage current. The β-value 74 is the ratio of the substrate current 70 to the anode current 72 (e.g., $I_{sub}/I_{anode}$). In this embodiment, the β-value 74 does not exceed 0.4. In other embodiments, the maximum β-value 74 does not exceed 0.3. It should be noted that these values for this embodiment is when the enclosed structure has a circular or ring shape with a diameter measured from the outer edge of N+ well 18 of approximately 9.5 µm. Other shapes and dimensions may have different current flows and/or β-values.

Figure 5:
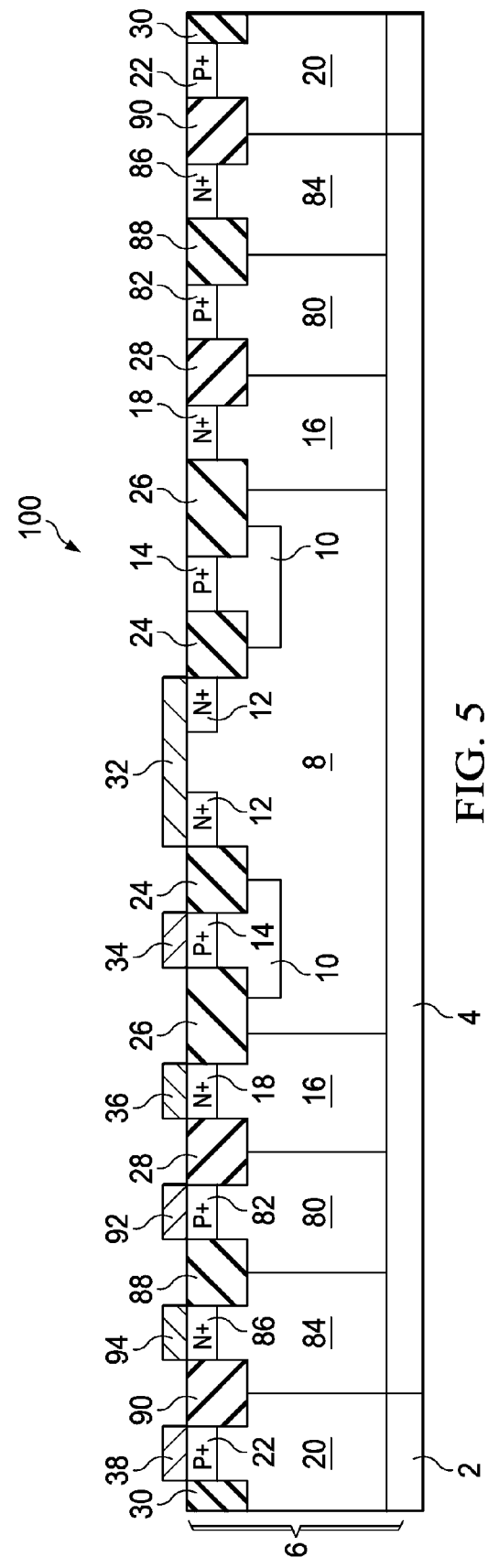
FIG. 5 is a cross-sectional view of another Schottky diode according to an embodiment.

FIG. 5 is a cross-sectional view of another Schottky diode 100 according to an embodiment. The diode 100 comprises many of the components of the diode 50 in FIG. 1, and like reference numerals refer to the same components. Thus, explicit description here is omitted for those components.

The epi-layer 6 further comprises a HVPW 80 around the HVNW 16. The HVPW 80 extends from a top surface of the epi-layer 6 to a top surface of the semiconductor substrate 2 and over the NBL 4. A P+ well 82 is in the HVPW 80 in the form of an enclosed structure along the top surface of the epi-layer 6 around the N+ well 18. The P+ well 82 extends from the top surface of the epi-layer 6 to a depth in the HVPW 80. The epi-layer 6 also comprises a HVNW 84 around the HVPW 80 and between the HVPW 80 and the HVPW 20. The HVNW 84 extends from a top surface of the epi-layer 6 to a top surface of the semiconductor substrate 2 and over the NBL 4. An N+ well 86 is in the HVNW 84 in the form of an enclosed structure along the top surface of the epi-layer 6 around the P+ well 82. The N+ well 86 extends from the top surface of the epi-layer 6 to a depth in the HVNW 84. These components may have features of similar components previously described.

An isolation structure 88 is between the P+ well 82 and the N+ well 86 extending from a top surface of the epi-layer 6 to a depth greater than both of the P+ well 82 and the N+ well 86. An isolation structure 90 is between the N+ well 86 and the P+ well 22 extending from a top surface of the epi-layer 6 to a depth greater than both of the N+ well 86 and the P+ well 22.

In addition to the first isolation contact 36, the diode 100 comprises a second isolation contact 92 and a third isolation contact 94. The second isolation contact 92 contacts an area of the P+ well 82 at the top surface of the epi-layer 6. The third isolation contact 94 contacts an area of the N+ well 86 at the top surface of the epi-layer 6. Although not explicitly shown, the first isolation contact 36, the second isolation contact 92, and the third isolation contact 94 are electrically coupled together, such as by a conductive material on the top surface of the epi-layer 6, through metallization layers in respective dielectric layers over the epi-layer, the like, or a combination thereof.

Figure 6:
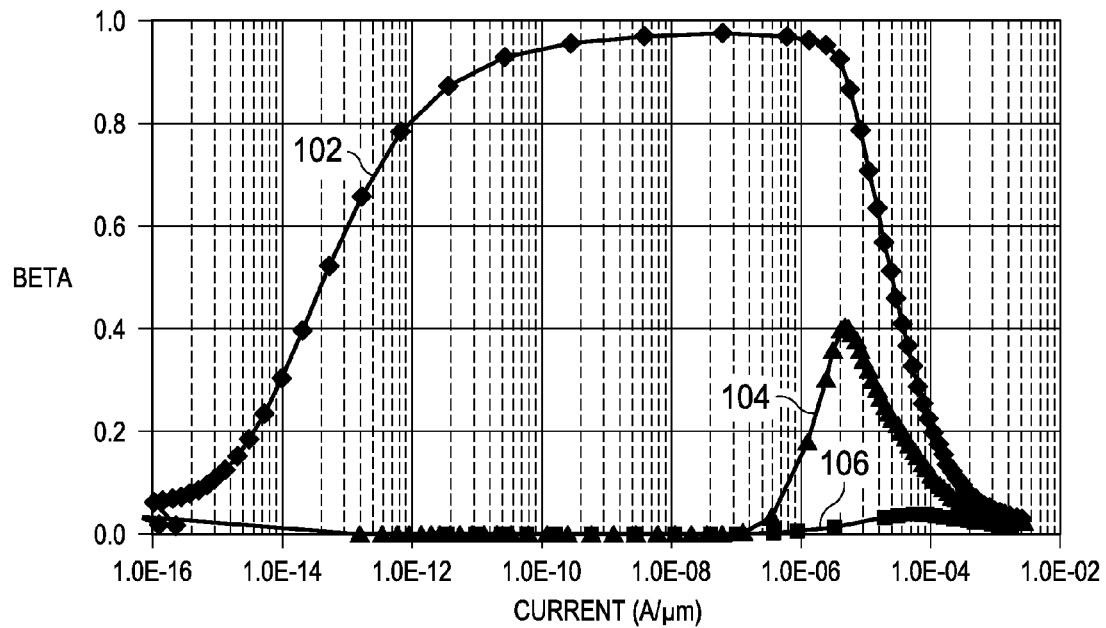
FIG. 6 is a chart comparing β-values as a function of injection current of the diode in FIG. 5.

FIG. 6 is a chart comparing β-values as a function of injection current. β-value 102 and β-value 104 are values for two previously known Schottky diodes. In those diodes, the β-value could reach values greater than 0.4. β-value 106 is a value for the embodiment of FIG. 5. In this embodiment, the maximum β-value 106 does not exceed 0.04. Further, in this embodiment, a breakdown voltage is approximately 60 V. It should be noted that these values for this embodiment is when the enclosed structure has a circular or ring shape with a diameter measured from the outer edge of N+ well 86 of approximately 9.5 µm. Other shapes and dimensions may have different β-values and breakdown voltages.

Figure 7:
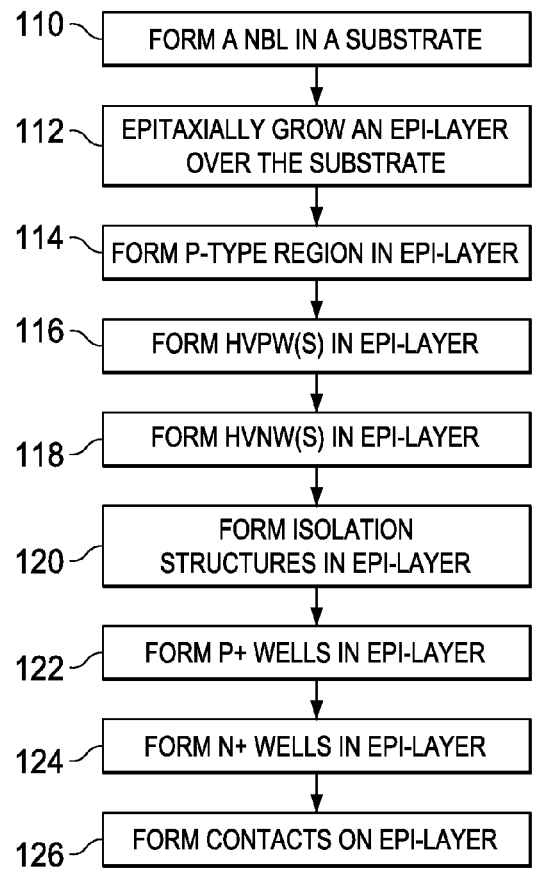
FIG. 7 is a process for forming the diodes of FIGS. 1 and 5 according to an embodiment.

FIG. 7 is a process for forming the diodes 50 and 100 previously discussed. A person having ordinary skill in the art will readily understand the applicability of materials, dopants, concentrations, dimensions, etc. previously discussed to the process disclosed here, and thus, these details are not explicitly described here. Further, a person having ordinary skill in the art will readily appreciate modifications to the process disclosed, for example, various orders of the steps described. These modifications are contemplated within the scope of other embodiments.

In step 110, a NBL is formed in a bulk semiconductor substrate. The NBL is formed, for example, by patterning a photoresist over the semiconductor substrate and implanting an n-type impurity in the semiconductor substrate. The photoresist is then removed, such as by an ash and/or flush process. In step 112, an epi-layer is epitaxially formed on the bulk semiconductor substrate. The epi-layer can be grown using, for example, molecular beam epitaxy (MBE), selective epitaxial growth (SEG), metalorganic chemical vapor deposition (MOCVD), the like, or a combination thereof. In step 114, a p-type region is formed in the epi-layer, such as by in situ doping during the epitaxial growth in step 112 and/or implanting after step 112. An implant may use a patterned photoresist, implanting a p-type impurity, and removing the photoresist.

In steps 116 and 118, HVPW(s) and HVNW(s), respectively, are formed in the epi-layer. Each of these steps is performed by, for example, by patterning a photoresist over the semiconductor substrate and implanting a respective p-type or n-type impurity in the semiconductor substrate. The photoresist is then removed, such as by an ash and/or flush process.

In step 120, isolation structures are formed in the epi-layer. In this embodiment, a photoresist is patterned to expose areas of the epi-layer in which the isolation structures are to be formed. The epi-layer then is etched to form recesses. The recesses are filed with an isolation material. In steps 122 and 124, P+ wells and N+ wells, respectively, are formed in the epi-layer. Each of these steps is performed by, for example, by patterning a photoresist over the semiconductor substrate and implanting a respective p-type or n-type impurity in the semiconductor substrate. The photoresist is then removed, such as by an ash and/or flush process. In steps 126, contacts are formed on the epi-layer. If the contacts are a silicide, a metal can be deposited over the epi-layer, such as by a chemical vapor deposition (CVD) process, the like, or a combination thereof. Then, an anneal may react the metal with the epi-layer to form the silicide. Excess metal may be removed by an etch process. Other contacts can be formed other acceptable methods.

As discussed above, embodiments may achieve a low substrate leakage when the diode turns "on." This may also realize a low β-value. Further, embodiments may also achieve a high breakdown voltage.

An embodiment is a semiconductor structure. The semiconductor structure comprises a p-type region in a substrate; a first n-type well in the p-type region; a first p-type well in the p-type region; and a second p-type well in the first p-type well. A concentration of a p-type impurity in the first p-type well is less than a concentration of a p-type impurity in the second p-type well.

Another embodiment is a semiconductor structure. The semiconductor structure comprises an anode region in a substrate, a cathode region in the substrate, an anode contact on the substrate, and a cathode contact on the substrate. The anode region comprises a first p-type well in a p-type region, and the p-type well is in the substrate. The anode region further comprises a second p-type well in the first p-type well. A concentration of a p-type impurity in the second p-type well is greater than a concentration of a p-type impurity in the first p-type well. The anode contact is electrically coupled to the second p-type well, and the anode contact comprises a metal. The cathode region comprises a first n-type well in the p-type region. The cathode contact is electrically coupled to the first n-type well and the p-type region, and the cathode contact comprises a metal.

A further embodiment is a method for forming a semiconductor structure. The method comprises forming a p-type region in a substrate; forming a first p-type well in the p-type region; forming a first n-type well in the p-type region; forming a second p-type well in the first p-type well; and forming a first contact and a second contact on the substrate. A concentration of a p-type impurity in the second p-type well is greater than a concentration of a p-type impurity in the first p-type well. The first contact is electrically coupled to the first n-type well and the p-type region, and the second contact is electrically coupled to the second p-type well. Each of the first contact and the second contact comprises a metal.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure comprising:
   a p-type region in a substrate and extending below a surface of the substrate, the p-type region having a first p-type impurity concentration;
   a first n-type well in the p-type region and extending from the surface of the substrate to below the surface of the substrate;
   a first p-type well in the p-type region and extending below the surface of the substrate, the first p-type well having a second p-type impurity concentration, the second p-type impurity concentration being greater than the first p-type impurity concentration, a portion of the p-type region with the first p-type impurity concentration being disposed directly below the first p-type well;
a second p-type well in the first p-type well and extending from the surface of the substrate to below the surface of the substrate, the second p-type well having a third p-type impurity concentration, the second p-type impurity concentration being less than the third p-type impurity concentration; and
a cathode contact over the surface of the substrate and electrically and directly coupled to the first n-type well.

2. The semiconductor structure of claim 1 further comprising an anode contact over the surface of the substrate and electrically and directly coupled to the second p-type well.

3. The semiconductor structure of claim 1 further comprising:
a second n-type well in the substrate, the second n-type well having a first n-type impurity concentration, the second n-type well being laterally adjacent to the p-type region;
a third n-type well in the second n-type well, the third n-type well having a second n-type impurity concentration, the first n-type impurity concentration being less than the second n-type impurity concentration;
a third p-type well in the substrate, the third p-type well having a fourth p-type impurity concentration; the third p-type well being laterally adjacent to the second n-type well; and
a fourth p-type well in the third p-type well, the fourth p-type well having a fifth p-type impurity concentration, the fourth p-type impurity concentration being less than the fifth p-type impurity concentration.

4. The semiconductor structure of claim 3 further comprising an isolation contact on the third n-type well, and a substrate contact on the fourth p-type well.

5. The semiconductor structure of claim 3 further comprising:
a fourth n-type well in the substrate, the fourth n-type well having a third n-type impurity concentration, the fourth n-type well being laterally adjacent to the third p-type well;
a fifth n-type well in the fourth n-type well, the fifth n-type well having a fourth n-type impurity concentration, the third n-type impurity concentration being less than the fourth n-type impurity concentration;
a fifth p-type well in the substrate, the fifth p-type well having a sixth p-type impurity concentration, the fifth p-type well being laterally adjacent to the fourth n-type well; and
a sixth p-type well in the fifth p-type well, the sixth p-type well having a seventh p-type impurity concentration, the sixth p-type impurity concentration being less than the seventh p-type impurity concentration.

6. The semiconductor structure of claim 5 further comprising:
a first isolation contact on the third n-type well;
a second isolation contact on the fourth p-type well;
a third isolation contact on the fifth n-type well, the first isolation contact, the second isolation contact, and the third isolation contact being electrically coupled together outside of the substrate; and
a substrate contact on the sixth p-type well.

7. The semiconductor structure of claim 1, wherein the substrate comprises an epitaxial layer, the p-type region being in the epitaxial layer.

8. The semiconductor structure of claim 1 further comprising an isolation structure in the substrate, the isolation structure being between the second p-type well and the first n-type well.

9. The semiconductor structure of claim 1 further comprising an n-type buried layer in the substrate, the p-type region being over the n-type buried layer.

10. A semiconductor structure comprising:
an anode region in a substrate and extending below a surface of the substrate, the anode region comprising:
a first p-type well in a p-type region and extending below the surface, the p-type region being in the substrate, a portion of the p-type region with a concentration of a p-type impurity in the p-type region being directly below the first p-type well, the concentration of the p-type impurity of the p-type region being less than a concentration of a p-type impurity in the first p-type well; and
a second p-type well in the first p-type well and extending from the surface to below the surface, a concentration of a p-type impurity in the second p-type well being greater than the concentration of the p-type impurity in the first p-type well;
an anode contact over the surface of the substrate, the anode contact being electrically coupled to the second p-type well, the anode contact comprising a metal;
a cathode region in the substrate and extending below the surface of the substrate, the cathode region comprising a first n-type well in the p-type region; and
a cathode contact over the surface of the substrate, the cathode contact being electrically and directly coupled to the first n-type well, the cathode contact comprising a metal.

11. The semiconductor structure of claim 10 further comprising an n-type buried layer in the substrate, the p-type region being over the n-type buried layer.

12. The semiconductor structure of claim 10, wherein the anode region encloses around the cathode region.

13. The semiconductor structure of claim 10 further comprising:
an isolation region in the substrate, the isolation region comprising:
a second n-type well in the substrate, the second n-type well laterally adjoining the p-type region; and
a third n-type well in the second n-type well, a concentration of an n-type impurity in the third n-type well being greater than a concentration of an n-type impurity in the second n-type well;
an isolation contact on the substrate, the isolation contact being electrically coupled to the third n-type well, the isolation contact comprising a metal;
a substrate region in the substrate, the substrate region comprising:
a third p-type well in the substrate, the third p-type well laterally adjoining the second n-type well; and
a fourth p-type well in the third p-type well, a concentration of a p-type impurity in the fourth p-type well being greater than a concentration of a p-type impurity in the third p-type well; and
a substrate contact on the substrate, the substrate contact being electrically coupled to the fourth p-type well, the substrate contact comprising a metal.

14. The semiconductor structure of claim 10 further comprising:
an isolation region in the substrate, the isolation region comprising:

a second n-type well in the substrate, the second n-type well laterally adjoining the p-type region; and a third n-type well in the second n-type well, a concentration of an n-type impurity in the third n-type well being greater than a concentration of an n-type impurity in the second n-type well;

a third p-type well in the substrate, the third p-type well laterally adjoining the second n-type well;

a fourth p-type well in the third p-type well, a concentration of a p-type impurity in the fourth p-type well being greater than a concentration of a p-type impurity in the third p-type well;

a fourth n-type well in the substrate, the fourth n-type well laterally adjoining the third p-type well; and a fifth n-type well in the fourth n-type well, a concentration of an n-type impurity in the fifth n-type well being greater than a concentration of an n-type impurity in the fourth n-type well;

an isolation contact structure on the substrate, the isolation contact structure comprising:

a first isolation contact electrically coupled to the third n-type well, the first isolation contact comprising a metal;

a second isolation contact electrically coupled to the fourth p-type well, the second isolation contact comprising a metal; and a third isolation contact electrically coupled to the fifth n-type well, the third isolation contact comprising a metal, the first isolation contact, the second isolation contact, and the third isolation contact being electrically coupled together outside of the substrate;

a substrate region in the substrate, the substrate region comprising:

a fifth p-type well in the substrate, the fifth p-type well laterally adjoining the fourth n-type well; and a sixth p-type well in the fifth p-type well, a concentration of a p-type impurity in the sixth p-type well being greater than a concentration of a p-type impurity in the fifth p-type well; and a substrate contact on the substrate, the substrate contact being electrically coupled to the sixth p-type well, the substrate contact comprising a metal.

15. A method for forming a semiconductor structure, the method comprising:

forming a p-type region in a substrate and to a first depth of the substrate from a surface of the substrate;

forming a first p-type well in the p-type region and to no further than a second depth of the substrate from the surface, the first depth being greater than the second depth;

forming a first n-type well in the p-type region;

forming a second p-type well in the first p-type well, a concentration of a p-type impurity in the second p-type well being greater than a concentration of a p-type impurity in the first p-type well; and forming a first contact and a second contact over the surface of the substrate, the first contact being electrically and directly coupled to the first n-type well, the second contact being electrically coupled to the second p-type well, each of the first contact and the second contact comprising a metal.

16. The method of claim 15 further comprising forming an n-type buried layer in the substrate, the n-type buried layer being under the p-type region.

17. The method of claim 15, wherein the substrate comprises a semiconductor layer epitaxially grown on a bulk semiconductor substrate.

18. The method of claim 15 further comprising forming an isolation structure between the first n-type well and the second p-type well.

19. The method of claim 15, wherein each of the forming the first p-type well, the forming the second p-type well, and forming the first n-type well comprises using an impurity implantation.

* * * * *